United States Patent
Nakata

(12) United States Patent (10) Patent No.: US 8,440,577 B2
Nakata (45) Date of Patent: May 14, 2013

(54) METHOD FOR REDUCING METAL, MULTILAYER INTERCONNECTION STRUCTURE AND MANUFACTURING METHOD FOR THE SAME, AND SEMICONDUCTOR DEVICE AND MANUFACTURING METHOD FOR THE SAME

(75) Inventor: Yoshihiro Nakata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1137 days.

(21) Appl. No.: 11/518,237

(22) Filed: Sep. 11, 2006

(65) Prior Publication Data
US 2007/0221509 A1 Sep. 27, 2007

(30) Foreign Application Priority Data
Mar. 24, 2006 (JP) ................. 2006-083864

(51) Int. Cl.
*H01L 21/302* (2006.01)
*H01L 21/28* (2006.01)

(52) U.S. Cl.
USPC .............. 438/754; 438/687; 438/637

(58) Field of Classification Search .......... 438/635, 438/637, 754, 687, 906; 257/E21.241, E21.244, 257/E21.245, E21.246; 216/17, 100, 101, 216/105, 106, 108; 134/2, 3, 41
See application file for complete search history.

(56) References Cited

U.S. PATENT DOCUMENTS

| | | | |
|---|---|---|---|
| 2,156,217 A * | 4/1939 | Andrews et al. .............. | 568/885 |
| 3,647,892 A | 3/1972 | Hoch | |
| 5,939,334 A * | 8/1999 | Nguyen et al. ............... | 438/689 |
| 6,482,740 B2 * | 11/2002 | Soininen et al. .............. | 438/686 |
| 6,664,179 B2 * | 12/2003 | Akbar et al. .................. | 438/635 |
| 6,805,138 B2 * | 10/2004 | Akbar et al. .................. | 134/1.2 |
| 6,943,431 B2 | 9/2005 | Fukuyama et al. | |
| 7,172,657 B2 * | 2/2007 | Kojima et al. ................ | 134/3 |
| 7,491,634 B2 * | 2/2009 | Huotari et al. ............... | 438/592 |

(Continued)

FOREIGN PATENT DOCUMENTS
CN 1433053 A 7/2003
EP 2 159 270 * 3/2010
(Continued)

OTHER PUBLICATIONS

German Office Action dated Jul. 18, 2007, issued in corresponding German Patent Application No. 10 2006 039 001.6-33.

(Continued)

*Primary Examiner* — Mary Wilczewski
(74) *Attorney, Agent, or Firm* — Westerman, Hattori, Daniels & Adrian, LLP

(57) ABSTRACT

To provide a reliable, efficient method for reducing oxidized metals used upon manufacturing of the multilayer interconnection structure, semiconductor device, etc. With this method vapor containing at least a carboxylic acid ester is hydrolyzed by water vapor to reduce oxidized metal. The multilayer interconnection manufacturing method of the present invention includes at least film formation step, interconnection formation step, and reduction step using the metal reduction method of the present invention. The multilayer interconnection structure of the present invention is manufactured by the multilayer interconnection structure manufacturing method of the present invention. The semiconductor device manufacturing method of the present invention includes at least film formation step, patterning step, interconnection formation step, and reduction step using the metal reduction method. The semiconductor device of the present invention includes at least multilayer interconnection structure of the present invention and is formed using the semiconductor device manufacturing method of the present invention.

15 Claims, 7 Drawing Sheets

U.S. PATENT DOCUMENTS

| | | | |
|---|---|---|---|
| 2001/0020478 A1* | 9/2001 | Kojima et al. | 134/3 |
| 2002/0004293 A1 | 1/2002 | Soininen et al. | |
| 2002/0092584 A1 | 7/2002 | Soininen et al. | |
| 2002/0098685 A1* | 7/2002 | Sophie et al. | 438/633 |
| 2003/0096468 A1 | 5/2003 | Soininen et al. | |
| 2003/0136423 A1 | 7/2003 | Akbar et al. | |
| 2004/0005753 A1 | 1/2004 | Kostamo et al. | |
| 2004/0029381 A1 | 2/2004 | Akbar et al. | |
| 2004/0038529 A1 | 2/2004 | Soininen et al. | |
| 2005/0212139 A1* | 9/2005 | Leinikka et al. | 257/762 |
| 2005/0215053 A1 | 9/2005 | Soininen et al. | |
| 2006/0084277 A1 | 4/2006 | Nakashima et al. | |
| 2008/0146042 A1 | 6/2008 | Kostamo et al. | |

FOREIGN PATENT DOCUMENTS

| | | |
|---|---|---|
| JP | 02036135 A | 2/1990 |
| JP | 2001-254178 A | 9/2001 |
| JP | 2001-271192 * | 10/2001 |
| JP | 2003-533880 A | 11/2003 |
| JP | 2004-71705 A | 3/2004 |
| JP | 2004-153147 A | 5/2004 |
| JP | 2007-258594 * | 10/2007 |
| WO | 01/88972 A1 | 11/2001 |

OTHER PUBLICATIONS

Chinese Office Action Jul. 25, 2008, issued in corresponding Chinese Patent Application No. 200610127475.2.

Japanese Office Action dated Mar. 9, 2010, issued in corresponding Japanese Patent Application No. 2006-083364.

Taiwanese Office Action dated Sep. 2, 2009 issued in corresponding Taiwanese Patent Application No. 095130803.

* cited by examiner

METHOD FOR REDUCING METAL, MULTILAYER INTERCONNECTION STRUCTURE AND MANUFACTURING METHOD FOR THE SAME, AND SEMICONDUCTOR DEVICE AND MANUFACTURING METHOD FOR THE SAME

CROSS-REFERENCE TO RELATED APPLICATIONS

This application is based upon and claims the benefits of the priority from the prior Japanese Patent Application No. 2006-083864 filed on Mar. 24, 2006, the entire contents of which are incorporated herein by reference.

BACKGROUND OF THE INVENTION

1. Field of the Invention

The present invention relates to a reliable, efficient method for reducing oxidized metal; a multilayer interconnection structure with reduced interconnection resistance where parasitic capacities between interconnections can be reduced with the method, and an efficient method for manufacturing the same; and a high-speed, highly-reliable semiconductor device having the multilayer interconnection structure, and an efficient method for manufacturing the same. More particularly, the present invention relates to a method for reducing copper oxide for reducing copper interconnections efficiently, reliably and inexpensively during the formation of a multilayer interconnection structure of a semiconductor integrated circuit.

2. Description of the Related Art

As the scale of integration of semiconductor integrated circuits and chip density have been increasing, so too has been, in particular, a demand to provide a multilayer structure of semiconductor chips. Against this background, the interval between adjacent interconnections, or interconnection interval, has become smaller and smaller, leading to a problem of interconnection delay due to increased capacities between interconnections. Here, the interconnection delay (T) is represented by the equation $T \propto RC$, which means that (T) is influenced by the interconnection resistance (R) and the capacity between adjacent interconnections (C). The relationship between permittivity ($\epsilon$) and capacity (C) is represented by the equation $C = \epsilon_0 \epsilon_r \cdot S/d$ (where S is an electrode area, so is the permittivity of vacuum, $\epsilon_r$ is the permittivity of an insulating film, and d is the interconnection interval). The reduction of capacity (C) can be achieved by reducing the interconnection thickness and electrode area, though, reducing the interconnection thickness causes an increase in the interconnection resistance (R), making it impossible to achieve speedup of the device. Accordingly, reducing both the permittivity of insulating films and the interconnection resistance is the effective way to achieve speedup by minimizing the interconnection delay (T).

In a semiconductor device with a multilayer interconnection structure, the interval between adjacent interconnections has become smaller and smaller, with the recent trend moving toward an increased scale of integration of semiconductor integrated circuits and greater chip density, thus leading to an increased impedance of metal interconnections due to electrostatic induction. For this reason, there is a great concern that response speed will be reduced and power consumption will be increased. To avoid this problem, it is necessary to reduce the permittivities of interlayer insulating films as small as possible, which are provided between the semiconductor substrate and metal interconnections or between interconnection layers.

Materials for conventional insulating films include inorganic materials such as silicon dioxide ($SiO_2$), silicon nitride (SiN) and phosphosilicate glass (PSG), and organic high-molecular materials such as polyimides. The CVD-$SiO_2$ film, an insulating film often used in semiconductor devices, however, has a permittivity of as high as 4. In addition, the SiOF film, an insulating film that has been studied as a candidate for a low-permittivity CVD film, has a permittivity of as small as 3.3 to 3.5, but highly hygroscopic; therefore, it has a problem that permittivity increases with time.

Moreover, for example, a porous silica-based low-permittivity film has been proposed (see Japanese Patent Application Laid-Open UP-A) No. 2004-153147) as a low-permittivity film. The production process for this film involves a pore formation step in which thermally decomposable components (e.g., organic resins that are evaporated or decomposed by heat) are added to a film formation material, and evaporated or decomposed by heat upon film deposition to thereby form pores therein. Thus, it is possible to further achieve permittivity reduction.

The pore size of this sort of porous film, however, is large—10 nm or more when produced using currently available methods. For this reason, increasing the porosity for reduced permittivity leads to a problem of increased permittivity and/or reduced film strength, which are caused due to moisture absorption. Moreover, although organic polymer films can be cited as films with excellent moisture resistance, their glass transition temperature is as low as 200° C. to 350° C. and their coefficient of thermal expansion is high. For this reason, they have a problem that they can damage interconnections.

Meanwhile, since the interconnection resistance decreases inversely with the interconnection volume, an increase in the interconnection resistance associated with finer interconnections cannot be avoided. In recent years, however, influences of the contact resistance of vias through which vertically adjacent interconnections of a multilayer interconnection structure are connected together have become a more serious problem than this interconnection resistance increase. More specifically, the surface of the interconnections to be connected to the vias is unfavorably oxidized to increase their contact resistance.

To solve this problem, copper oxide present at the surface of the interconnections to be connected to the vias needs to be reduced to copper. However, conventional annealing approaches performed under reduction gas (e.g., ammonia gas and hydrogen gas) atmosphere cannot achieve satisfactory reduction.

In addition, reduction methods using ammonia plasma or hydrogen plasma can be used; however, such methods damage low-permittivity insulating films to result in increased permittivity.

Furthermore, a method has been proposed in which an organic acid such as formic acid or acetic acid is gasified and the resultant gas is used as reduction gas (see, for example, Japanese Patent Application Laid-Open (JP-A) No. 2004-71705). When forming interconnections by depositing metal such as copper on the surface of a silicon wafer or the like using a CVD apparatus with this method, a thin metal film is formed also on the inner wall of the chamber. This thin metal film is chelated by the reduction gas, sublimated, and exhausted out of the chamber.

This method, however, is only intended for the removal of the thin metal film attached to the inner wall of the chamber;

this Patent Literature fails to disclose or suggest a method for reducing the surface of oxidized interconnections and its effects.

In contrast to the foregoing plasma reduction method, this method can achieve reduction of the surface of interconnections that are formed on a silicon wafer or the like without increasing the permittivities of films, though, it is difficult to control the reduction rate because the reduction reaction is rapid. Moreover, this method has a problem that the gasified organic acid forms a dimer, which reacts with copper and scatters it over the surface of the silicon wafer or the like.

It is an object of the present invention to solve the foregoing problems and to achieve the object described below.

Specifically, it is an object of the present invention to provide a reliable, efficient method for reducing oxidized metal; a multilayer interconnection structure with reduced interconnection resistance where parasitic capacities between interconnections can be reduced with the method, and an efficient method for manufacturing the same; and a high-speed, highly-reliable semiconductor device having the multilayer interconnection structure, and an efficient method for manufacturing the same. More particularly, the present invention relates to a method for reducing copper oxide for reducing copper interconnections efficiently, reliably and inexpensively during the formation of a multilayer interconnection structure of a semiconductor integrated circuit.

SUMMARY OF THE INVENTION

The means for solving the foregoing problems are listed in the appended claims.

That is, the method of the present invention for reducing a metal is characterized by hydrolyzing a vapor containing at least a carboxylic acid ester by a water vapor to thereby reduce oxidized metal. With this method the vapor containing at least a carboxylic acid ester is hydrolyzed by the water vapor to produce a carboxylic acid, which reduces oxidized metal to metal in a short time with reliability. In addition, use of water vapor facilitates the control of reduction rates and can realize low-cost, efficient metal reduction. Moreover, hydrolysis by water vapor can inhibit dimerization of a carboxylic acid, preventing the occurrence of copper splashes upon reduction treatment.

Thus, employment of this method for the manufacturing of a multilayer interconnection structure realizes low-cost, reliable reduction of oxidized interconnection, reduced interconnection resistance, and reduction treatment that entails no reduction in the permittivities of insulating films. For these reasons, this method can reduce parasitic capacities between interconnections and is particularly suitable for the manufacturing of the multilayer interconnection structure of the present invention. Moreover, since the permittivity of the insulating film can be kept low, both parasitic capacities and interconnection resistance are low, and it is possible to increase signal propagation speed. Thus, this method is particularly suitable for the manufacturing of highly-integrated semiconductor integrated circuits such as ICs and LSIs.

Conventionally, it has been known that increased parasitic capacities in insulating films cause a reduction in signal propagation speed. In a semiconductor device with an interconnection pitch of as large as 1 µm or more, however, interconnection delay has less effect on the whole of the semiconductor device. In recent years, interconnection width and interconnection pitch are becoming narrower and narrower along with increased packaging densities of semiconductor integrated circuits and with the advent of multilayer interconnection structures; in particular, the problem of increased interconnection resistance and increased parasitic capacities is prominent in semiconductor devices with an interconnection pitch of as small as 1 µm or less. Because both the interconnection resistance and parasitic capacities between interconnections—major factors that control the performance of devices such as semiconductor integrated circuits—determine the signal propagation speed in a multilayer interconnection structure of the semiconductor integrated circuits, the increased interconnection resistance and increased parasitic capacities are a big problem that needs to be overcome as the cause that reduces signal propagation speed. For an increased signal propagation speed, it is necessary to reduce both the interconnection resistance and the parasitic capacities between interconnections (or the permittivities of the insulating films). Although the parasitic capacities between interconnections can be reduced by making the interconnections thin to reduce their cross-section areas, thin interconnections cause an increase in the interconnection resistance. This means that achieving an increased signal propagation speed is a trade-off between reduced parasitic capacities between interconnections and reduced interconnection resistance.

In recent years increased contact resistance, caused due to oxidization of interconnection surface connected to a via through which vertically adjacent interconnections of a multilayer interconnection structure are connected together, have become a more serious problem than interconnection resistance increase caused due to a finer interconnection pattern. Furthermore, the following problems have been presented: Conventional reduction methods that involve hydrogen annealing never increase the permittivities of the insulating films but cannot fully reduce the interconnections, and conventional reduction methods that involve hydrogen plasma treatment or the like can ensure excellent reduction but increase the permittivity of the insulating film. In addition, conventional reduction methods using organic acids have a problem of metal splashes caused due to dimerization of the organic acid.

However, the method of the present invention for reducing a metal can realize low-cost, efficient and reliable reduction of interconnection, can prevent interconnection resistance increase due to oxidization, and can achieve reduced interconnection resistance and reduced parasitic capacities between interconnections without increasing the permittivities of insulating films, making it possible to increase signal propagation speed.

The method of the present invention for manufacturing a multilayer interconnection structure includes at least a film formation step of forming a film on a work surface, interconnection formation step of forming an interconnection on the work surface, and reduction step of subjecting the surface of the interconnection on the work surface to reduction treatment using the metal reduction method of the present invention. With this manufacturing method, the film is formed in the film formation step, the interconnection is formed in the interconnection formation step, and oxidized metal at the surface of the interconnection is reduced to metal in the reduction step. By repealing a series of steps including the film formation step, interconnection formation and reduction step, the multilayer interconnection structure of the present invention is efficiently manufactured without causing resistance increase due to oxidization. This manufacturing method is particularly suitable for the manufacturing of the multilayer interconnection structure of the present invention.

The multilayer interconnection structure of the present invention is formed using the method of the present invention for forming a multilayer interconnection structure. In this multilayer interconnection structure, the surface of interconnections is subjected to reduction treatment when they are formed. Thus, it is possible to provide reduced interconnection resistance and to reduce parasitic capacities without increasing the permittivities of insulating films, making it possible to increase signal propagation speed. The multilayer interconnection structure of the present invention is therefore suitable for semiconductor integrated circuits and the like that require high response speed.

The semiconductor device of the present invention is characterized by including at least the multilayer interconnection structure of the present invention.

In this semiconductor device, oxidized metal on the interconnections is reduced to metal using the metal reduction method of the present invention. Accordingly, this semiconductor device is allowed to include a multilayer interconnection structure having reduced interconnection resistance without increasing the permittivity of the insulating film; therefore, it is possible to achieve reduced parasitic capacities between interconnections and reduced interconnection resistance. Thus, the semiconductor device of the present invention is particularly suitable, for example, for flash memories, DRAMs, FRAMs and MOS transistors, which are high-speed and highly reliable.

The method of the present invention for manufacturing a semiconductor device is characterized by including at least a film formation step of forming a film on a work surface, a patterning step of patterning the work surface by an etching process using the film as a mask, an interconnection formation step of forming an interconnection on the work surface, and a reduction step of subjecting the surface of the interconnection formed on the work surface to reduction treatment using the metal reduction method of the present invention. With this manufacturing method, a film is formed on a work surface, where a multilayer interconnection structure is to be formed, using a film formation material in the film formation step, the work surface is patterned by an etching process using the film as a mask in the patterning step, an interconnection is formed in the interconnection formation step, and oxidized metal at the surface of the interconnection is reduced to metal in the reduction step. Thus, it is possible to reduce both the parasitic capacities between interconnections and interconnection resistance, and to efficiently manufacture a high-performance semiconductor device capable of increasing signal propagation speed. This manufacturing method is particularly suitable for the manufacturing of the semiconductor device of the present invention.

In a conventional semiconductor manufacturing process, circuits are formed by forming a laminate of alternating conductive layers (interconnection layers) and insulating layers (films). Such a process, however has the following problem: when vias that connect vertically adjacent interconnections together are to be formed, the surface of the interconnections is undesirably oxidized, increasing the contact resistance. According to the semiconductor manufacturing method of the present invention, however, oxidized metal at the surface of the interconnections is reduced to metal by means of the metal reduction method of the present invention. Thus, it is possible to prevent interconnection resistance increase, caused due to oxidization, with reliability, to achieve reduced parasitic capacities without increasing the permittivity of the insulating film and reduced interconnection resistance, and to increase signal propagation speed.

Figure 1:
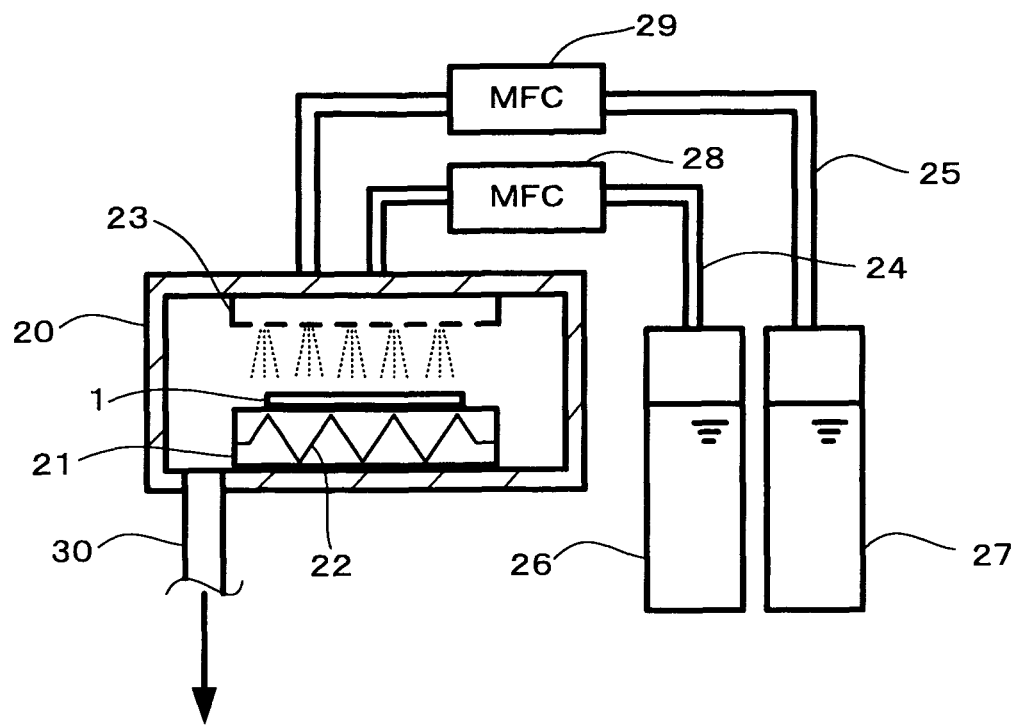
FIG. 1 shows an example of a metal reduction apparatus for performing the method of the present invention for reducing metal.

DESCRIPTION OF THE PREFERRED EMBODIMENTS (Method for Reducing Metal)

The method of the present invention for reducing metal is performed by hydrolyzing, using a water vapor, a vapor that contains a carboxylic acid ester and, on an as-needed basis, additional constituent(s).

Metals that undergo reduction are not particularly limited and can be appropriately determined depending on the intended purpose; examples include oxidized metals. Specific examples include copper oxide; zinc oxide, iron oxide and aluminum oxide. Among these, copper oxide is preferable.

Reduction targets may be either metals themselves or metal-containing molds. Examples of such metal-containing molds include semiconductor substrates having interconnections formed, such as a silicon wafer and a gallium-arsenic wafer, circuit substrates made of resin or ceramic, and bump substrates. Among these, for example, semiconductor substrates and circuit substrates made of resin or ceramic are preferable.

<Carboxylic Acid Esters>

Carboxylic acid esters are not particularly limited and can be appropriately determined depending on the intended purpose; suitable examples include, but not limited to, those expressed by one of the following general formulae (1) and (2):

 General Formula (1)

 General Formula (2)

(where $R_1$ and $R_2$ each represents a hydrocarbon of 1 to 3 carbon atoms, n represents an integer of 1 to 3, and m represents an integer of 3 to 7)

Specific examples of compounds expressed by the general formula (1) include methyl formate, ethyl formate, propyl formate, and isopropyl formate. Among these, for example, methyl formate and ethyl formate are preferable.

Specific examples of compounds expressed by the general formula (2) include methyl acetate, ethyl acetate, propyl acetate, isopropyl acetate, methyl propionate, ethyl propionate, propyl propionate, and isoprolyl propionate. Among these, for example, ethyl acetate and methyl acetate are preferable.

<Additional Constituent>

Examples of the additional constituent include water-soluble solvents such as methyl alcohol, ethyl alcohol, propyl alcohol, isopropyl alcohol, acetone, tetrahydrofuran, and acetonitrile. Among these, for example, methyl alcohol and ethyl alcohol are preferable.

Such additional constituent(s) is mixed with the carboxylic acid ester, and is vaporized to promote the hydrolysis of the carboxylic acid ester.

<Hydrolysis of Carboxylic Acid Ester and Reduction of Metal>

The carboxylic acid ester produces an alcohol upon hydrolysis by a water vapor, and the alcohol reacts with oxygen present in an oxidized metal, thereby allowing the oxidized metal present at the metal surface to be reduced to copper efficiently and reliably.

Control of the reduction rate is easier with this method that involves hydrolysis of the carboxylic acid ester than with methods using only organic acid gas. With this method, it is possible to achieve reduction of metal efficiently and inexpensively.

In addition, dimerization of a carboxylic acid can be prevented by utilizing water vapor for hydrolysis, thus preventing a carboxylic acid produced during the reduction process from bonding to metal and preventing splashes of metal bonded to the carboxylic acid.

The reduction treatment is preferably performed under heating conditions. To be more specific, an oxidized metal or a substrate with oxidized metal is heated by heating means (e.g., heater) for reduction of the oxidized metal. In this way more efficient, reliable reduction can be achieved.

The heating temperature is preferably 50° C. to 400° C., more preferably 150° C. to 350° C. If the heating temperature is less than 50° C., it may result in poor reduction performance. If the heating temperature is greater than 400° C., it may result in reduced interconnection reliability due to mobilization of metal grains.

The reduction treatment is preferably performed under vacuum.

At this point, the vacuum pressure is preferably 50 Pa to 500 Pa, more preferably 100 Pa to 300 Pa. If the vacuum pressure is less than 50 Pa, it may result in poor reduction performance. If the vacuum pressure is greater than 500 Pa, metal may be etched.

The reduction rate can be controlled by changing the hydrolysis temperature and feed rate of a water vapor. That is, it is possible to increase the reduction rate by setting the hydrolysis temperature to a certain level or higher and by increasing the flow rate of the water vapor.

The hydrolysis temperature is preferably 50° C. to 200° C., more preferably 80° C. to 150° C. If the hydrolysis temperature is less than 50° C., the hydrolysis reaction progresses slowly, reducing the reduction rate in some cases. If the hydrolysis temperature is greater than 200° C., the carboxylic acid ester may be thermally decomposed.

The ratio of flow rates between carboxylic acid ester and water vapor is preferably 1:0.2 to 1:2, more preferably 1:0.5 to 1:1.5. If this ratio is less than 1:0.2, it may result in poor hydrolysis performance. If this ratio is greater than 1:2, the water vapor may oxidize the metal surface.

The reduction treatment time is not particularly limited and can be appropriately determined depending on the intended purpose, preferably determined depending on the surface area of the oxidized metal to be reduced, and/or on the thickness of the oxidized metal; it is preferably 5 seconds to 600 seconds, more preferably 10 seconds to 300 seconds. If the treatment time is less than 5 seconds, the oxidized metal may not be fully reduced. If the treatment time is greater than 600 seconds, treatment efficiency may be reduced.

The hydrolysis and reduction treatments are preferably conducted in a chamber in light of operability and efficiency. However, hydrolysis of a carboxylic acid ester may be conducted in the chamber, or may be conducted before it is introduced into the chamber.

More specifically, both a compound that contains at least a carboxylic acid ester and water are vaporized by heat, for example, in different ovens, and the resultant vapors are supplied to a vacuum chamber, where the vapor that contains at least the carboxylic acid ester and the water vapor are mixed together to promote the hydrolysis of the carboxylic acid ester.

Alternatively, a mixture of a compound that contains a carboxylic acid ester and water may be vaporized by heating in a supply line to cause a hydrolysis reaction to take place, followed by introduction of the resultant vapor into the chamber.

To prevent dimerization of the carboxylic acid that resulted from this hydrolysis reaction, it is preferable that the vapor containing at least the carboxylic acid ester and the water vapor be individually introduced into the chamber for hydrolysis of the carboxylic acid ester. More preferably, a shower head for spraying vapor onto a target metal is provided in the vacuum chamber and, immediately before spraying vapor by means of the shower head, the vapor containing the carboxylic acid ester and water vapor are mixed together for hydrolysis.

An example of a metal reduction apparatus for implementing the metal reduction method of the present invention will be described with reference to the drawings.

As shown in FIG. 1, in the metal reduction apparatus, a support board 21 on which a reduction target (e.g., a silicon wafer 1) is placed is provided inside a chamber 20 for reduction treatment. A heater 22 which heats the chamber 20 and keeps its temperature constant and/or which heats a reduction target (e.g., the silicon wafer 1) is housed in the support board 21. A shower head 23 is provided at the upper side of the chamber 20. One end of a supply pipe 24 for a vapor containing at least a carboxylic acid ester, and one end of a supply pipe 25 for a water vapor are connected to the shower head 23. The other end of the supply pipe 24 is connected to a storage tank 26 for compounds that contain at least a carboxylic acid ester, and the other end of the supply pipe 25 is connected to a storage tank 27 for water.

Moreover, the supply pipes 24 and 25 are provided with mass flow controllers (MFC) 28 and 29, respectively, by which the flow rates of the carboxylic acid ester-containing vapor and water vapor into the chamber 20 can be adjusted.

In addition, the chamber 20 is provided with an exhaust port 30 connected to a vacuum pump (not shown), which enables to reduce the pressure inside the chamber 20 and to eject by-products of the reduction reaction.

Although the metal reduction apparatus may be freshly manufactured for implementing the metal reduction method of the present invention, such a metal reduction apparatus can be obtained by arranging the foregoing supply pipes and other components in the processing chamber of any of known apparatuses such as CVD apparatus, PVD apparatus, and plating apparatus. The apparatus of this sort realizes continuous implement of the metal reduction method of the present invention after the finish of CVD, PVD and plating treatments, realizing efficient processing.

The metal reduction method of the present invention can realize low-cost, efficient and reliable reduction of oxidized metal, and thus is suitable for multilayer interconnection structures and semiconductor devices such as semiconductor integrated circuits, all of which require reduced parasitic capacities between interconnections, reduced interconnection resistance, and high-speed response speed. In particular, the metal reduction method of the present invention is suitable for the multilayer interconnection structure and semiconductor device of the present invention.

(Multilayer Interconnection Structure and Manufacturing Method for the Same)

The method of the present invention for manufacturing a multilayer interconnection structure is the one for manufacturing the multilayer interconnection structure of the present invention, and includes at least a film formation step, an interconnection formation step, and a reduction step, and further includes additional step(s) on an as-needed basis.

The multilayer interconnection structure of the present invention is manufactured with this method.

Through descriptions of the method of the present invention for manufacturing a multilayer interconnection structure, details of the multilayer interconnection structure of the present invention will also be revealed.

<Film Formation Step>

The film formation step is the one in which a film formation material is deposited on a work surface, and heated to form films such as interlayer insulating films and protective films.

The film formation material contains at least resin and, on an as-needed basis, an organic solvent and additional constituent(s).

The resin is not particularly limited and can be appropriately determined depending on the intended purpose; examples include siloxane resins and organic resins, which can provide low-permittivity films.

For example, CVD films formed by plasma CVD are a suitable example of such films.

Suitable examples of the siloxane resins include polymers resulted from polymerization of silane compounds used as monomer units.

Specific examples of such silane compounds include tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilan, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane, and propylvinyldialkoxysilane. These polymers may be used singly or in combination.

Examples of the organic resins include polyarylether and benzocyclobutene polymers.

Examples of the CVD films formed by plasma CVD include a carbon-doped $SiO_2$ film, SiCH film, and SiCN film.

The organic solvent is not particularly limited as long as it can dissolve the foregoing resins, and can be appropriately selected depending on the intended purpose; examples include alcohols such as methyl alcohol, ethyl alcohol, propyl alcohol, isopropyl alcohol, butyl alcohol, isobutyl alcohol and tertiary-butyl alcohol; phenols such as phenol, cresol, diethylphenol, triethylphenol, propylphenol, nonylphenol, vinylphenol and allylphenol; ketones such as cyclohexanone, methyl isobutyl ketone and methyl ethyl ketone; cellusolves such as methyl cellosolve and ethyl cellosolve; hydrocarbons such as hexane, octane and decane; and glycols such as propylene glycol, propylene glycol monoethyl ether, and propylene glycol monoethyl ether acetate. These organic solvents may be used singly or in combination.

The additional constituent(s) is not particularly limited as long is as the effects of the present invention are not impaired, and can be appropriately determined depending on the intended purpose; examples include blowing agents used to make films porous, and various known additives.

Examples of such blowing agents include acrylic resins, ethylene resins, and cellulose resins.

The content of the additional constituent(s) is appropriately determined according to the identity and/or content of the resin, organic solvent and the like.

The work surface is not particularly limited and can be appropriately determined depending on the intended purpose. For example, when the film is to be formed in a semiconductor device, the surface of its semiconductor substrate is an example. More specifically, the surfaces of substrates (e.g., silicon wafers), various oxide films, and low-permittivity films (e.g., porous insulating films) are suitable examples.

The film deposition method is not particularly limited and can be appropriately determined depending on the intended purpose. Examples include spin coating, dip coating, kneader coating, curtain coating, and blade coating. Among these, spin coating, dip coating or the like is preferable in view of, for example, its coating efficiency. In the case of spin coating, preferable conditions under which spin coating is performed are as follows: Rotational speed is about 100 rpm to 10,000 rpm, more preferably 800 rpm to 5,000 rpm; spin coating time is about 1 second to 10 minutes, more preferably 10 seconds to 90 seconds.

The heat treatment is not particularly limited and can be appropriately determined depending on the intended purpose; it is preferable that the organic solvent be dried and that the film formation material be baked. By this heat treatment, it is possible to prevent oxidization of hydrocarbons and/or aromatic hydrocarbons, which have been introduced into the polymer frames and/or side chains of resin present in the film formation material.

Heat treatment conditions (e.g., temperature and atmosphere) can be changed depending on the intended purpose; however, heat treatment temperature is preferably 50° C. to 400° C., more preferably 80° C. to 350° C.

If the heat treatment temperature is less than 50° C., the organic solvent remains trapped in the film to reduce film strength in some cases. If the heat treatment temperature is greater than 400° C., silicon-hydrocarbon bonds in the polymer frames and/or side chains of the resin may break.

The heat treatment is preferably conducted, for example, in the presence of inert gas or under vacuum because, if conducted in the atmosphere, it may result in increased permittivity due to intake of oxygen. Suitable examples of inert gas include nitrogen gas.

Note that when the backing layer of the film is one formed by, for example, spin coating (e.g., a low-permittivity film such as a porous silica film), heat treatment for the material for forming this low-permittivity film and for the film formation material may be performed at the same time (i.e., after providing the material for forming the low-permittivity film and drying the solvent, the film formation material is placed on the material, and heat treatment is conducted). In this case, it is possible to reduce costs involved in film deposition.

<Interconnection Formation Step>

The interconnection formation step is the one for forming interconnections (multilayer interconnection structure).

For the formation of the multilayer interconnection structure, the interconnection formation step preferably includes appropriately selected additional steps, such as a through via formation step and a conductor plating step.

-Through Via Formation Step-

The through via formation step is the one in which though vias are formed that are connected to the interconnections formed in the uppermost layer of the silica-based film formed on the work surface.

The though vias can be formed by applying laser light of suitable exposure level to portions where they are to be formed, for example.

The laser light is not particularly limited and can be appropriately determined depending on the intended purpose. Examples include $CO_2$ laser, excimer laser, and YAG laser.

-Conductor Plating Step-

The conductor plating step is the one in which a conductor, an interconnection precursor, is applied on the entire surface of the silica-based film formed on the work surface to form a conductor plating layer.

For example, typical plating methods such as electroless plating and electroplating can be used for conductor plating.

The formation of the interconnections can be achieved by etching the conductor plating layer, which has been formed in the conductor plating step, to produce a desired interconnection pattern.

The etching method is not particularly limited and can be appropriately selected from typical etching methods according to the intended purpose.

In this way the interconnections are formed.

<Reduction Step>

The reduction step is the one in which the surface of interconnections that have been formed on the work surface in the interconnection formation step is subjected to reduction treatment using the metal reduction method of the present invention.

This reduction step is conducted by hydrolyzing a vapor that contains at least a carboxylic acid ester by a water vapor. Details of the carboxylic acid ester, hydrolysis and reduction reactions thereof and the like are identical to those given in the description of the metal reduction method of the present invention.

Oxidized metal present at the surface of the interconnection is reduced to metal through these steps.

A series of the film formation step, interconnection formation step (including the through via formation step and conductor plating step) and reduction step is repeated as needed. Thus, it is possible to reduce, for example, the resistance of a multilayer interconnection structure and resistance of through vias that connect vertically adjacent interconnections of the multilayer interconnection structure together, and to manufacture a multilayer interconnection structure with highly integrated circuits.

The method of the present invention for manufacturing a multilayer interconnection structure can be suitably used in various fields. In particular, this method can be suitably used for the manufacturing of the multilayer interconnection structure of the present invention.

Since the surface of interconnection is reduced with the metal reduction method of the present invention that can achieve low-cost, efficient and reliable reduction of oxidized metal, the multilayer interconnection structure of the present invention can achieve the followings: reduced interconnection resistance achieved by preventing the oxidization of interconnections; reduced parasitic capacities without increasing the permittivities of films; and high-speed signal propagation. Thus, the multilayer interconnection structure of the present invention is suitable for semiconductor devices such as semiconductor integrated circuits that require high response speed, particularly for the semiconductor device of the present invention described below.

(Semiconductor Device and Manufacturing Method for the Same)

The semiconductor device of the present invention includes at least the multilayer interconnection structure of the present invention.

The method of the present invention for manufacturing a semiconductor device is the one for manufacturing the semiconductor device of the present invention; the method includes at least a film formation step, a patterning step, an interconnection formation step, and a reduction step, and further includes additional step(s) on an as-needed basis.

Through descriptions of the method of the present invention for manufacturing a semiconductor device, details of the multilayer semiconductor device of the present invention will also be revealed.

<Film Formation Step>

The film formation step is the one in which a film is formed on the work surface using the film formation material.

Note that details of the work surface, film formation material and the like are identical to those given above.

The film formation step preferably involves deposition of the film formation material on the work surface and heat treatment for it. This can be suitably performed in a known manufacturing method. Note that the description for this deposition method is identical to that given in the description of the film formation step of the multilayer interconnection structure.

The heat treatment is not particularly limited and can be appropriately determined depending on the intended purpose; it is preferable that the organic solvent in the material be dried and that the film formation material be baked. By this heat treatment, it is possible to prevent oxidization of hydrocarbons and/or aromatic hydrocarbons introduced into the polymer frames and/or side chains of resin present in the film formation material.

Heat treatment conditions (e.g., temperature and atmosphere) can be changed depending on the intended purpose; however, heat treatment temperature is preferably 50° C. to 400° C., more preferably 80° C. to 350° C.

If the heat treatment temperature is less than 50° C., the organic solvent remains trapped in the film to reduce its film strength in some cases. If the heat treatment temperature is greater than 400° C., silicon-hydrocarbon bonds in the polymer frames and/or side chains of the resin may break.

The heat treatment is preferably conducted, for example, in the presence of inert gas or under vacuum because, if conducted in the atmosphere, it may result in increased permittivity due to intake of oxygen. Suitable examples of inert gas include nitrogen gas.

Note that when the backing layer of the film is one formed using, for example, spin coating (e.g., a low-permittivity film such as a porous silica film), heat treatment for the material for forming this low-permittivity film and for the film formation material may be performed at the same time (i.e., after providing the material for the low-permittivity film and drying the solvent, the film formation material is placed on this material, and heat treatment is conducted). In this case, it is possible to reduce costs involved in film deposition.

<Patterning Step>

The patterning step is the one in which the work surface is patterned by etching process using as a mask the foregoing film obtained in the film formation step.

In the patterning step it is preferable that the work surface be etched using a mask of desired pattern that has been obtained by selectively exposing and developing the film. In this case, the work surface can be readily etched in a desired pattern.

This pattern can be produced in accordance with a known pattern formation method.

To promote reactions, baking treatment may be performed between the exposure and development operations.

The etching method is not particularly limited and can be appropriately determined depending on the intended purpose; suitable examples include dry etching and wet etching.

<Interconnection Formation Step>

The interconnection formation step is the one in which interconnections are formed; details thereof are identical to those given above.

<Reduction Step>

The reduction step is the one in which the surface of interconnection is reduced with the metal reduction method of the present invention, and details thereof are identical to those given in the description for the metal reduction method.

A series of the film formation step, patterning step, interconnection formation step (including the through via formation step and conductor plating step), and reduction step is repeated as needed. Thus, a semiconductor device can be manufactured that has a multilayer interconnection structure with reduced interconnection resistance and highly integrated circuits.

An example of the semiconductor device of the present invention will be described with reference to the drawings.

Figure 4:
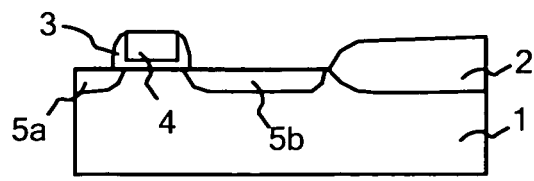
FIG. 4 is a first step view of an example of the semiconductor manufacturing method of the present invention using the metal reduction method of the present invention.
Figure 5:
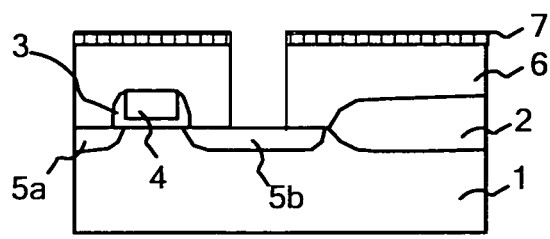
FIG. 5 is a second step view of the example of the semiconductor manufacturing method of the present invention using the metal reduction method of the present invention.
Figure 6:
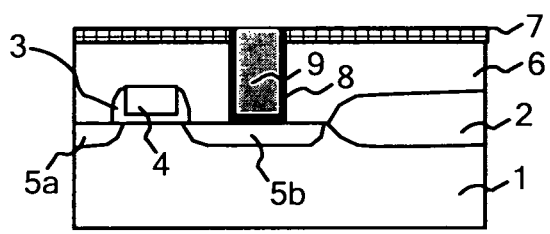
FIG. 6 is a third step view of the example of the semiconductor manufacturing method of the present invention using the metal reduction method of the present invention.

The semiconductor device of the present invention can be provided in the following manner, for example. At first, as shown in FIG. 4, a silicon wafer 1 provided with a transistor layer that includes a source diffusion layer 5a, a drain diffusion layer 5b and a gate electrode 4 having a side wall insulating film 3 is prepared, the elements being separated by an element separation film 2. As shown in FIG. 5, an interlayer insulating film 6 (phosphosilicate glass) and a stopper film 7 (SiC) are then formed on the silicon wafer 1, followed by formation of a contact hole for the electrode. As shown in FIG. 6, a barrier film 8 (TiN) of 50 nm thickness is formed in the contact hole by sputtering, and $WF_6$ gas is reduced by hydrogen to embed a conductor plug 9 (blanket) made of W in the contact hole and form a via, followed by removal of W from areas other than the via by CMP (Chemical Mechanical Polishing).

Figure 7:
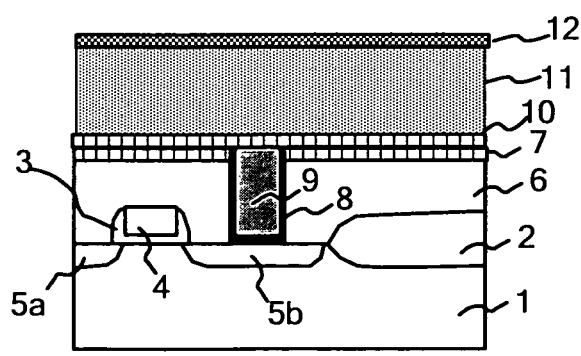
FIG. 7 is a fourth step view of the example of the semiconductor manufacturing method of the present invention using the metal reduction method of the present invention.
Figure 8:
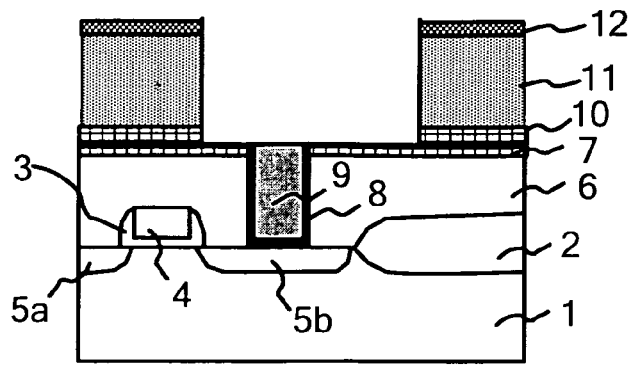
FIG. 8 is a fifth step view of the example of the semiconductor manufacturing method of the present invention using the metal reduction method of the present invention.
Figure 9:
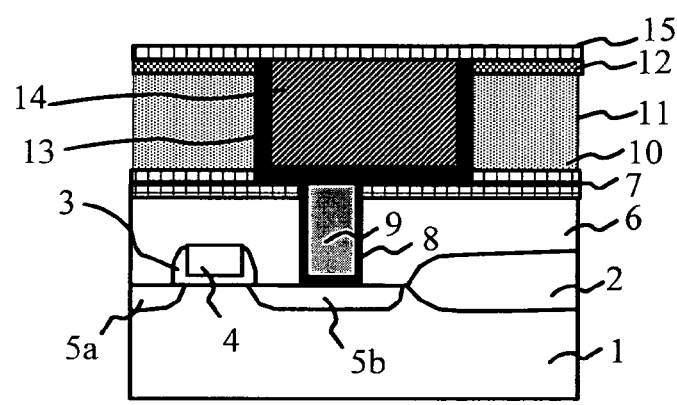
FIG. 9 is a sixth step view of the example of the semiconductor manufacturing method of the present invention using the metal reduction method of the present invention.

As shown in FIG. 7, a SiC:O:H film 10 of 30 nm thickness is formed on the stopper film 7 provided with the via, and a porous silica film 11 (a low-permittivity film, or an insulating film for separating adjacent interconnection layers) of 160 nm thickness is disposed on the SiC:O:H film 10. A $SiO_2$ film 12 is then deposited on the porous silica film 11 to a thickness of 30 nm by plasma CVD. As shown in FIG. 8, the $SiO_2$ film 12 is processed by F-plasma derived from $CF_4/CHF_3$ gas, while using as a mask a resist layer having a first-level interconnection pattern of 100 nm interconnection width and 100 nm spaces. In this way an interconnection trench is formed. Subsequently, as shown in FIG. 9, a barrier film 13 (TaN) of 10 nm thickness is formed in the interconnection trench by sputtering, the barrier film 13 preventing interconnection material (copper) from being diffused in the porous silica film 11. A seed layer (Cu) that serves as an electrode upon electroplating is then formed on the surface of the barrier film 13 to a thickness of 10 nm. A copper interconnection 14 (Cu) is deposited on the substrate to a thickness of about 600 nm by electroplating, and copper is removed from areas other than the interconnection trench by CMP (Chemical Mechanical Polishing). Thereafter, a SiC:O:H film of 30 nm is formed on the first level interconnection layer (copper) as a stopper film (diffusion prevention film) 15 to finish the first level interconnection layer (Cu). The purpose of providing the stopper film (diffusion prevention film) 15 is to prevent diffusion of interconnection material (copper) into the porous silica film 11. The stopper film 15 is formed by plasma CVD of a silane compound using ammonia gas.

Figure 10:
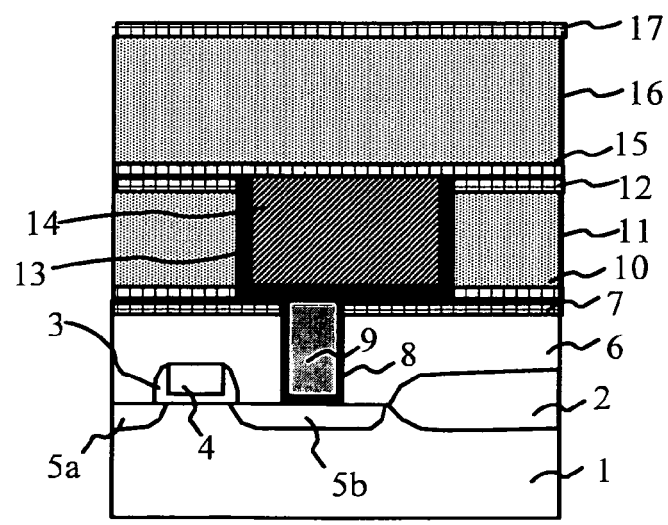
FIG. 10 is a seventh step view of the example of the semiconductor manufacturing method of the present invention using the metal reduction method of the present invention.
Figure 11:
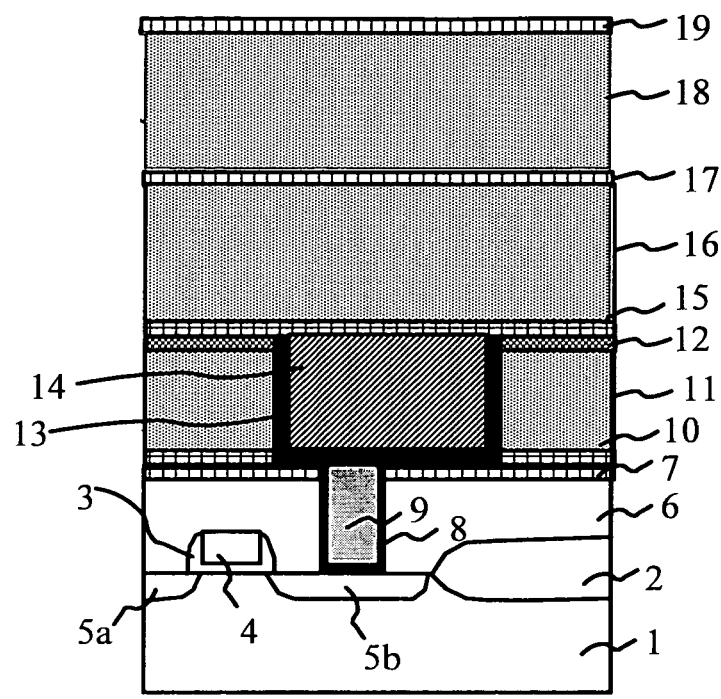
FIG. 11 is an eighth step view of the example of the semiconductor manufacturing method of the present invention using the metal reduction method of the present invention.

Next, as shown in FIG. 10, a porous silica film 16 (a low-permittivity film; an insulating film for separating adjacent interconnection layers, a SiOC film) of 180 nm thickness is disposed on the stopper film (diffusion prevention film) 15. After forming a SiC:O:H film 17 of 30 nm thickness on the porous silica film 16 by plasma CVD, a porous silica film (a low-permittivity film) 18 of 160 nm thickness is formed on the SiC:O:H film 17 as shown in FIG. 11, and a $SiO_2$ film 19 of 30 nm thickness is formed on the porous silica film 18 by plasma CVD.

Figure 12:
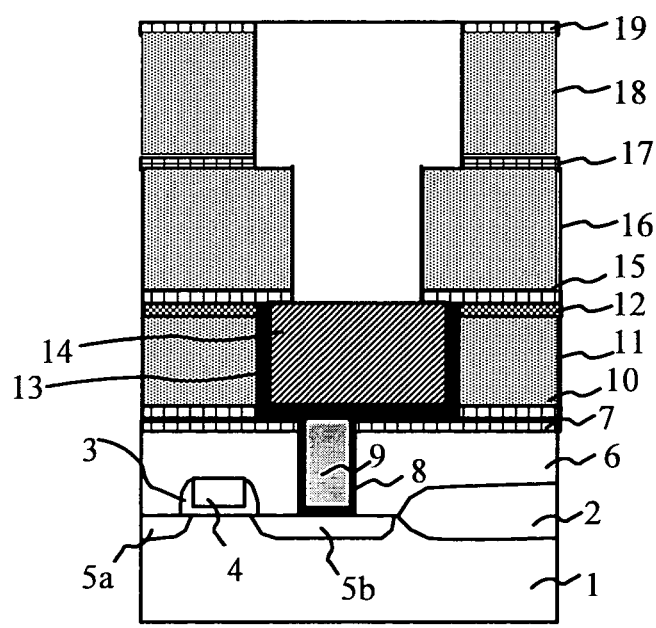
FIG. 12 is a ninth step view of the example of the semiconductor manufacturing method of the present invention using the metal reduction method of the present invention.

Next, using a resist layer with a via pattern as a mask, the $SiO_2$ film 19, porous silica film 18, SiC:O:H film 17 and porous silica film 16 are sequentially processed by F-plasma derived from $CF_4/CHF_3$ gas to form a via therein while changing the gas composition and pressure for each film, as shown in FIG. 12. Using a resist layer with a second level interconnection pattern as a mask, an interconnection trench is then formed using F plasma derived from $CF_4/CHF_3$ gas.

Figure 13:
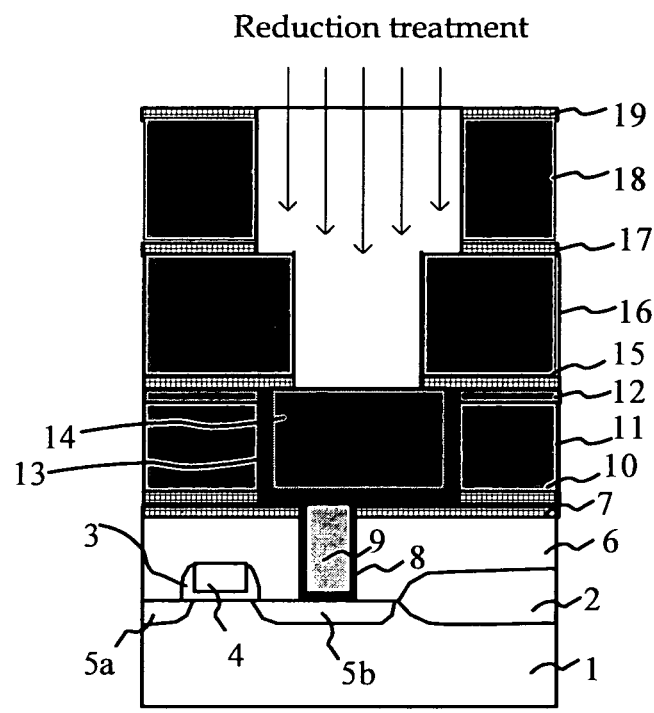
FIG. 13 is a tenth step view of the example of the semiconductor manufacturing method of the present invention using the metal reduction method of the present invention.
Figure 14:
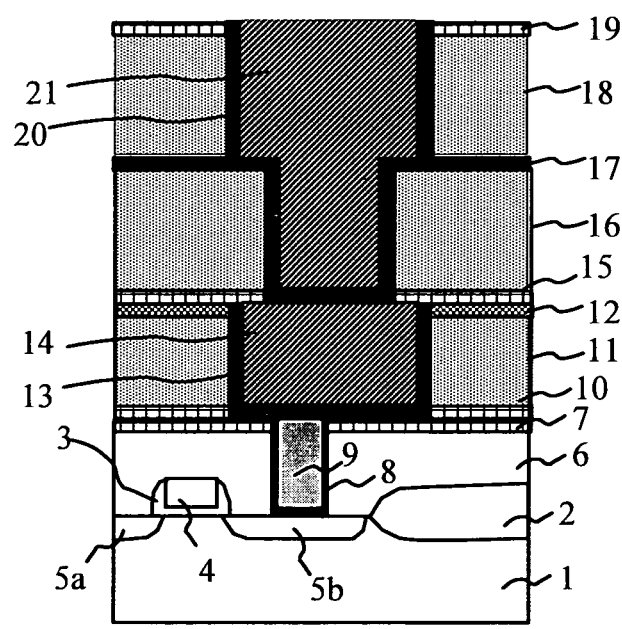
FIG. 14 is an eleventh step view of the example of the semiconductor manufacturing method of the present invention using the metal reduction method of the present invention.
Figure 15:
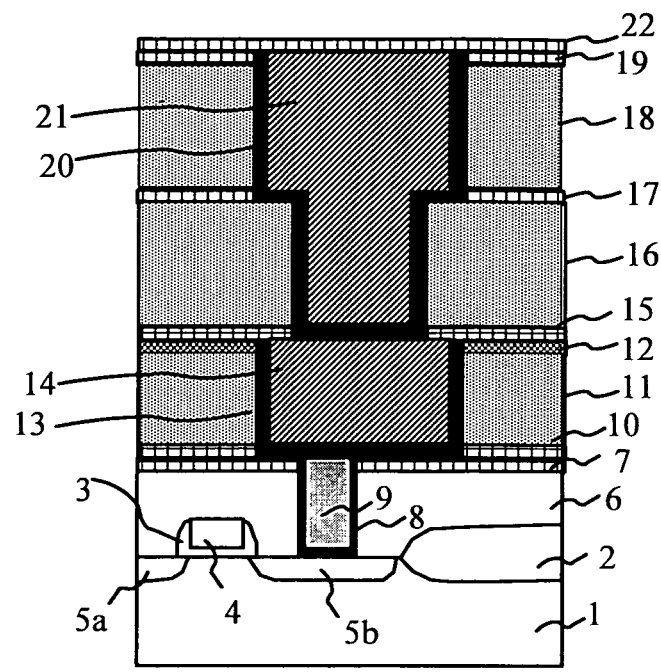
FIG. 15 is a twelfth step view of the example of the semiconductor manufacturing method of the present invention using the metal reduction method of the present invention.

Subsequently, both the via and the copper interconnection 14 thus formed are subjected to reduction treatment using the metal reduction method of the present invention, as shown in FIG. 13. Thereafter, as shown in FIG. 14, a barrier film 20 (TaN) of 10 nm thickness, which prevents interconnection material (copper) from being diffused in the porous silica film 18, is formed on both the via and interconnection trench by sputtering. By sputtering, a seed layer (Cu) that serves as an electrode upon electroplating is then formed on the surface of the barrier film 20 to a thickness of 10 nm. A copper interconnection 21 (Cu) is deposited on the substrate to a thickness of about 1,400 nm by electroplating, and copper is removed from areas other than the interconnection trench by CMP (Chemical Mechanical Polishing). Thereafter, as shown in FIG. 15, a SiC:O:H film 22 of 30 nm is deposited by vapor deposition to form second level vias and a second level interconnection layer (Cu).

By forming vias and an interconnection layer (copper) that are identical to those in the second level and subjecting them to reduction treatment, a semiconductor device with three levels of copper interconnection can be manufactured that has the third level vias and third level interconnection layer (this copper interconnection structure corresponds to the multilayer interconnection structure of the present invention).

The method of the present invention for manufacturing a semiconductor device can be suitably used to manufacture a semiconductor device with a multilayer interconnection structure. With this method, it is possible to prevent an increase in the resistance of the multilayer interconnection structure and the resistance of vias that connect vertically adjacent interconnections, caused due to oxidization, to thereby achieve reduced parasitic capacities between interconnections and reduced interconnection resistance, and to efficiently manufacture a high-performance semiconductor device capable of increasing signal propagation speed. This method is particularly suitable for the manufacturing of the semiconductor device of the present invention having the multilayer interconnection structure of the present invention.

The semiconductor device of the present invention includes at least the multilayer interconnection structure of the present invention, which has been manufactured using the metal reduction method of present invention. In the multilayer interconnection structure of the present invention, films have low values of permittivity, interconnection resistance is low, and both reduced parasitic capacities between interconnections and reduced interconnection resistance can be achieved, allowing provision of a high-speed, highly-reliable semiconductor device.

The semiconductor device of the present invention is particularly suitable, for example, for flash memories, DRAMs, FRAMs, and MOS transistors.

Hereinafter, Examples of the present invention will be described, which however shall not be construed as limiting the invention thereto.

[Preparation of Silicon Wafer]
-Preparation of Porous Silica Precursor Coating Solution (Film Formation Material)-

A 200-ml reaction vessel was charged with 20.8 g (0.1 mol) tetraethoxysilane, 17.8 g (0.1 mol) of methyltriethoxysilane, 23.6 g (0.1 mol) of glycidoxypropyltrimethoxysilane and 39.6 g of methyl isobutyl ketone, and 16.2 g (0.9 mol) of a 1% aqueous solution of tetramethylammoniumhydroxide was added dropwise to the reaction vessel by taking 10 minutes. The reaction vessel was then allowed to stand for about 2 hours for maturity.

Five grams of magnesium sulfate was added to the reaction vessel to remove excess water. Thereafter, ethanol resulted from the maturation reaction was removed using a rotary evaporator, so that the final volume of the reaction solution was 50 ml. To the resultant solution was added 20 ml of methyl isobutyl ketone to prepare a porous silica precursor coating solution.

-Preparation of Porous Silica Film-

The porous silica precursor coating solution thus prepared was applied over a silicon wafer to a thickness of 1 μm by spin coating at 3,000 rpm for 30 seconds. The silicon wafer was placed on a hot plate of 200° C. for 3 minutes under nitrogen gas atmosphere to remove an organic solvent. Furthermore, the silicon wafer was placed in an electric furnace of 400° C., and baked for 30 minutes under nitrogen gas atmosphere to prepare a porous silica film.

[Evaluation for the Permittivity of Porous Silica Film]
<Permittivity Measurement Prior to Reduction Treatment>

A metallic electrode of 1 mm diameter was fabricated on the resultant porous silica film, and its capacity was measured using a prober connected with an AC source of 1V and 1 MHz. The permittivity of the porous silica film determined by measuring the capacity and thickness was 2.3.

The porous silica film on the silicon wafer was exposed to environments employed for the metal reduction method of the present invention (Examples 1 to 3) and conventional metal reduction methods (Comparative Examples 1 to 4) to evaluate the susceptibility of permittivity to such environments.

EXAMPLE 1

Reduction Treatment>

A silicon wafer 1 provided with the foregoing porous silica film was placed on a support board 21 in a chamber 20 of a metal reduction apparatus as shown in FIG. 1. Subsequently, a reduction source (ethyl formate) and a hydrolysis source (water) were heated to temperatures described below, vaporized, and introduced in the chamber 20 at flow rates described below. In this way the porous silica film on the silicon wafer 1 was exposed to the reduction treatment environment described below. Note that the substrate temperature described below indicates the temperature of the silicon wafer 1 heated by a heater 22 provided in the chamber 20.
-Reduction Source-
   Source: Ethyl formate
   Source heating temperature: 80° C.
   Flow rate: 400 sccm
Hydrolysis Source
   Source: Water
   Source heating temperature: 80° C.
   Flow rate: 100 sccm
Exposure Atmosphere
   Substrate temperature: 250° C.
   Pressure in chamber: 100 Pa
   Treatment time: 180 seconds
<Permittivity Measurement>

After exposing the porous silica film to such an environment, permittivity was measured in a manner similar to that used for the measurement before the exposure treatment; permittivity was not changed from 2.3.

EXAMPLE 2

<Reduction Treatment>

A porous silica film on a silicon wafer, obtained in a manner similar to that described above, was exposed to the reduction treatment atmosphere of Example 2 using a metal reduction apparatus similar to that of Example 1, shown in FIG. 1, in a manner similar to that described in Example 1 except that the reduction source was changed to the species described below.
-Reduction Source-
   Source: Ethyl acetate
   Source heating temperature: 80° C.
   Flow rate: 400 sccm
-Hydrolysis Source-
   Source: Water
   Source heating temperature: 80° C.
   Flow rate: 100 sccm
-Exposure Atmosphere-
   Substrate temperature: 250° C.
   Pressure in chamber: 100 Pa
   Treatment time: 180 seconds <Permittivity Measurement>

After exposing the porous silica film to such an environment, permittivity was measured in a manner similar to that used for the measurement before the exposure treatment; permittivity was not changed from 2.3.

EXAMPLE 3

<Reduction Treatment>

A porous silica film on a silicon wafer, obtained in a manner similar to that described above, was exposed to the reduction treatment atmosphere of Example 3 using a metal reduction apparatus similar to that of Example 1, shown in FIG. 1, in a manner similar to that described in Example 1 except that the reduction source was changed to the species described below.
-Reduction Source-
  Source: Methyl propionate
  Source heating temperature: 80° C.
  Flow rate: 400 sccm
-Hydrolysis Source-
  Source: Water
  Source heating temperature: 80° C.
  Flow rate: 100 sccm
-Exposure Atmosphere-
  Substrate temperature: 250° C.
  Pressure in chamber: 100 Pa
  Treatment time: 180 seconds
<Permittivity Measurement>

After exposing the porous silica film to such an environment, permittivity was measured in a manner similar to that used for the measurement before the exposure treatment; permittivity was not changed from 2.3.

COMPARATIVE EXAMPLE 1

<Reduction Treatment>

A porous silica film on a silicon wafer, obtained in a manner similar to that described above, was exposed to a conventional hydrogen plasma atmosphere using a metal reduction apparatus similar to that of Example 1, shown in FIG. 1.
-Reduction Source-
  Source: Hydrogen
  Flow rate: 100 sccm
-Exposure Atmosphere-
  Substrate temperature: 250° C.
  Pressure in chamber: 100 Pa
  Applied voltage: 500 W
  Treatment time: 180 seconds
<Permittivity Measurement>

After exposing the porous silica film to such an environment, permittivity was measured in a manner similar to that used for the measurement before the exposure treatment; permittivity was increased to as high as 3.4.

COMPARATIVE EXAMPLE 2

<Reduction Treatment>

A porous silica film on a silicon wafer, obtained in a manner similar to that described above, was exposed to a conventional hydrogen annealing atmosphere using a metal reduction apparatus similar to that of Example 1, shown in FIG. 1.
-Reduction Source-
  Source: Hydrogen
  Flow rate: 100 sccm
-Exposure Atmosphere-
  Substrate temperature: 250° C.
  Pressure in chamber: 100 Pa
  Treatment time: 180 seconds
<Permittivity Measurement>

After exposing the porous silica film to such an environment, permittivity was measured in a manner similar to that used for the measurement before the exposure treatment; permittivity was not changed from 2.3.

COMPARATIVE EXAMPLE 3

<Reduction treatment>

A porous silica film on a silicon wafer, obtained in a manner similar to that described above, was exposed to the reduction treatment atmosphere described below using a metal reduction apparatus shown in FIG. 1, similar to that of Example 1. Here, as a reduction source, only formic acid was introduced into the apparatus under the condition described below.
-Reduction Source-
  Source: Formic acid
  Source heating temperature: 80° C.
  Flow rate: 500 sccm
-Exposure Atmosphere-
  Substrate temperature: 250° C.
  Pressure in chamber: 100 Pa
  Treatment time: 180 seconds
<Permittivity Measurement>

After exposing the porous silica film to such an environment, permittivity was measured in a manner similar to that used for the measurement before the exposure treatment; permittivity was not changed from 2.3.

COMPARATIVE EXAMPLE 4

<Reduction Treatment>

A porous silica film on a silicon wafer, obtained in a manner similar to that described above, was exposed to the reduction treatment atmosphere described below using a metal reduction apparatus shown in FIG. 1, similar to that of Example 1. Here, as a reduction source, only formic acid was introduced into the apparatus under the condition described below.
-Reduction Source-
  Source: Formic acid
  Source heating temperature: 80° C.
  Flow rate: 400 sccm
-Hydrolysis Source-
  Source: Water
  Source heating temperature: 80° C.
  Flow rate: 100 sccm
-Exposure Atmosphere-
  Substrate temperature: 250° C.
  Pressure in chamber: 100 Pa
  Treatment time: 180 seconds
<Permittivity Measurement>

After exposing the porous silica film to such an environment, permittivity was measured in a manner similar to that used for the measurement before the exposure treatment; permittivity was not changed from 2.3.

[Evaluation of the Presence of Copper Splashes Created after Reduction Treatment]

The presence of copper splashes after performing the metal reduction method of the present invention (Example 4) and conventional metal reduction methods (Comparative Examples 5 and 6) was evaluated.

EXAMPLE 4

Figure 2:
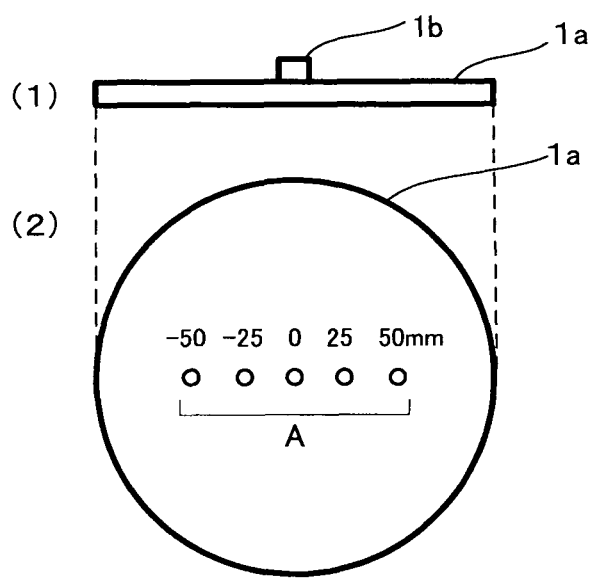
FIG. 2 is a side view (1) and a top view (2) of a silicon wafer used in reduction treatments of Examples and Comparative Examples, the side view (1) showing a state where a copper-plated silicon wafer is disposed on the silicon wafer, and the top view (2) showing the measurement points for determining the presence of copper splashes on the silicon wafer.

As shown in the side view (1) of FIG. 2, a silicon wafer 1b of 1 cm square, plated with copper of 1 μm thickness, was placed on the center of a silicon wafer 1a of 8 inch diameter, thus preparing a sample. Using a metal reduction apparatus similar to that of Example 1, this sample was subjected to reduction treatment under conditions similar to those of Example 1 (reduction source: ethyl formate), followed by determination of the presence of copper splashes in the following manner.

<Determination of the Presence of Copper Splashes>

Figure 3:
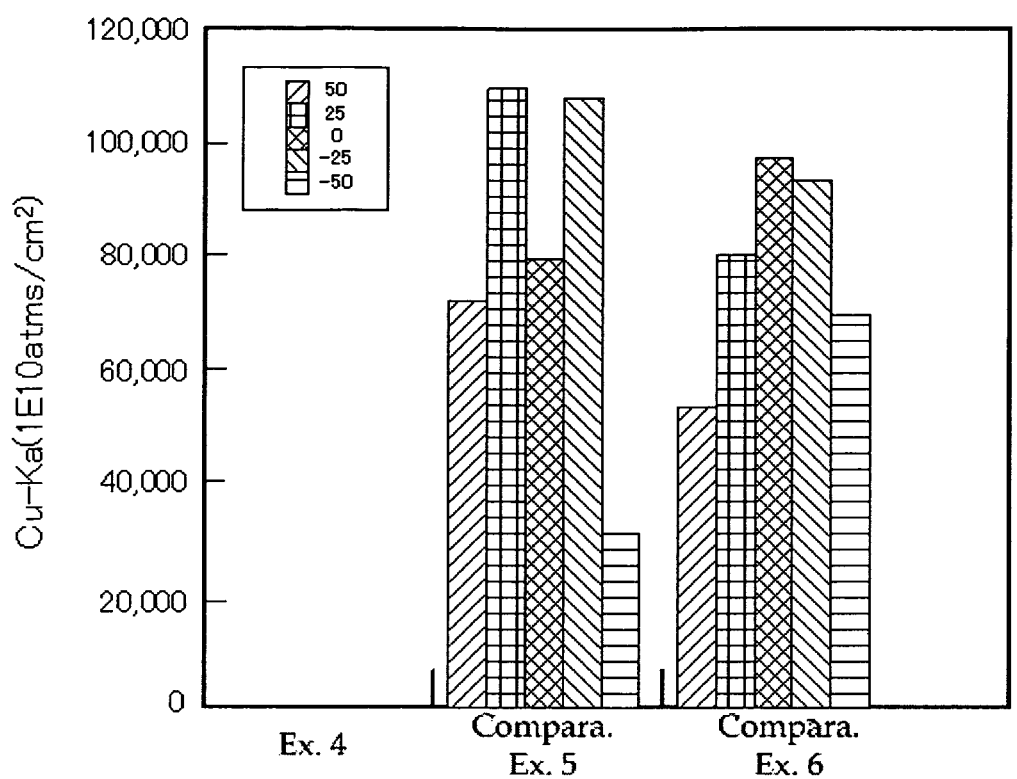
FIG. 3 is a graph showing the levels of copper splashes measured in Example 4 and Comparative Examples 5 and 6.

Dots indicated by "A" in the top view (2) of FIG. 2 are measurement points for copper splashes. Using fluorescent X-ray, determination of the presence of copper splashes was made on these five spots in terms of the number of copper atoms per unit area: A spot on the center of the silicon wafer 1a; two spots on either side of the center spot at a distance of 25 mm; and two spots on either side of the center spot at a distance of 50 mm. The results are shown in the graph of FIG. 3. No copper splashes were detected in Example 4.

COMPARATIVE EXAMPLE 5

Using a metal reduction apparatus similar to that of Comparative Example 3, a sample similar to that prepared in Example 4 was subjected to reduction treatment under conditions similar to those described in Comparative Example 3 (reduction source: formic acid).

Subsequently, an evaluation for the presence of copper splashes was made in a manner similar to that described in Example 4. The results are shown in the graph of FIG. 3.

As can be seen from this graph, many copper splashes were detected in Comparative Example 5.

COMPARATIVE EXAMPLE 6

Using a metal reduction apparatus similar to that of Comparative Example 4, a sample similar that prepared in Example 4 was subjected to reduction treatment under conditions similar to those described in Comparative Example 4 (reduction source: formic acid, hydrolysis source: water).

Subsequently, an evaluation for the presence of copper splashes was made in a manner similar to that described in Example 4. The results are shown in the graph of FIG. 3.

As can be seen from this graph, many copper splashes were detected in Comparative Example 6.

[Evaluation of the Resistance of the Multilayer Interconnection Structure and Semiconductor Device]

Multilayer interconnection structures and semiconductor devices were fabricated with the reduction method of the present invention and conventional ones, and each of them was evaluated for its performance in a manner described later.

EXAMPLES 5 TO 20

<Manufacturing of the Multilayer Interconnection Structure and Semiconductor Device>

The multilayer interconnection structures and semiconductor devices of Examples 5 to 20 were manufactured in the following manner.

At first, as shown in FIG. 4, a silicon wafer 1 provided with a transistor layer that includes a source diffusion layer 5a, a drain diffusion layer 5b and a gate electrode 4 having a side wall insulating film 3 was prepared, the elements being separated by an element separation film 2. As shown in FIG. 5, an interlayer insulating film 6 (phosphosilicate glass) and a stopper film 7 (SiC) were then formed on the silicon wafer 1, followed by formation of a contact hole for the electrode. As shown in FIG. 6, a barrier film 8 (TiN) of 50 nm thickness was formed in the contact hole by sputtering, and $WF_6$ gas was reduced by hydrogen to embed a conductor plug 9 (blanket) made of W in the contact hole and form a via, followed by removal of W from areas other than the via by CMP (Chemical Mechanical Polishing).

As shown in FIG. 7, a SiC:O:H film 10 of 30 nm thickness was formed on the stopper film 7 provided with the via, and a porous silica film 11 (a low-permittivity film, or an insulating film for separating adjacent interconnection layers) of 160 nm thickness was disposed on the SiC:O:H film 10. By plasma CVD, a $SiO_2$ film 12 was then deposited on the porous silica film 11 to a thickness of 30 nm. As shown in FIG. 8, the $SiO_2$ film 12 was then processed by F-plasma derived from $CF_4$/ $CHF_3$ gas, while using as a mask a resist layer having a first level interconnection pattern of 100 nm interconnection width and 100 nm spaces. In this way an interconnection trench was formed therein. Subsequently, as shown in FIG. 9, a barrier film 13 (TaN) of 10 nm thickness was formed in the interconnection trench by sputtering, the barrier film 13 preventing interconnection material (copper) from being diffused in the porous silica film 11. A seed layer (Cu) that serves as an electrode upon electroplating was then formed on the surface of the barrier film 13 to a thickness of 10 nm by sputtering. A copper interconnection 14 (Cu) was deposited on the substrate to a thickness of about 600 nm by electroplating, and copper was removed from areas other than the interconnection trench by CMP (Chemical Mechanical Polishing). Thereafter, a SiC:O:H film of 30 nm thickness was formed on the first level interconnection layer (copper) as a stopper film (diffusion prevention film) 15 to finish the first level interconnection layer (Cu). The purpose of providing the stopper film (diffusion prevention film) 15 is to prevent diffusion of interconnection material (copper) into the porous silica film 11. The stopper film 15 was formed by plasma CVD of a silane compound using ammonia gas.

Next, as shown in FIG. 10, a porous silica film 16 (a low-permittivity film; an insulating film for separating adjacent interconnection layers, a SiOC film) of 180 nm thickness was disposed on the stopper film (diffusion prevention film) 15. After forming a SiC:O:H film 17 of 30 nm thickness on the porous silica film 16 by plasma CVD, a porous silica film (a low-permittivity film) 18 of 160 nm thickness was formed on the SiC:O:H film 17 as shown in FIG. 11, and a $SiO_2$ film 19 of 30 nm was formed on the porous silica film 18 by plasma CVD.

Next, using a resist layer with a via pattern as a mask, the $SiO_2$ film 19, porous silica film 18, SiC:O:H film 17 and porous silica film 16 were sequentially processed by F-plasma derived from $CF_4$/$CHF_3$ gas to form a via therein while changing the gas composition and pressure for each film, as shown in FIG. 12. Using a resist layer with a second level interconnection pattern as a mask, an interconnection trench was then formed using F plasma derived from $CF_4$/ $CHF_3$ gas.

Subsequently, as shown in FIG. 13, each of the silicon wafers 1 of Examples 5 to 20 thus prepared was subjected to reduction treatment for the reduction of the via and the copper interconnection 14 (reduction source: ethyl fomate) using a metal reduction apparatus similar to that of Example 1 under conditions similar to those described in Example 1 except that the substrate temperature and treatment time were changed to those shown in Table 1.

Thereafter, as shown in FIG. 14, a barrier film 20 (TaN), which prevents interconnection material (copper) from being diffused in the porous silica film 18, was formed by sputtering on both the via and interconnection trench to a thickness of 10 nm. A seed layer (Cu) that serves as an electrode upon electroplating was then formed on the surface of the barrier film 20 to a thickness of 10 nm. A copper interconnection 21 (Cu) was deposited on the substrate to a thickness of about 1,400 nm by electroplating, and copper is removed from areas other than the interconnection trench by CMP (Chemical Mechanical Polishing). Thereafter, as shown in FIG. 15, a SiC:O:H film 22 of 30 nm was deposited by vapor deposition to form a second level via and a second level interconnection layer (Cu).

By forming vias and an interconnection layer (copper) that are identical to those in the second level and subjecting them to reduction treatment, a semiconductor device with three levels of copper interconnection was manufactured that has the third level vias and third level interconnection layer (this copper interconnection structure corresponds to the multilayer interconnection structure of the present invention).

<Evaluation of the Multilayer Interconnection Structure and Semiconductor Device>

In this way, one million semiconductor devices with vias that connect interconnections were manufactured, and the yield of the vias was determined to be 95%. In addition, resistance per one via was measured, and the ratio between this resistance value and a theoretical resistance value calculated from contact area was determined. As shown in Table 1, the via resistance ratio is in a range of 1.0 to 1.2 in all cases, leading to the conclusion that reduction was fully conducted.

EXAMPLES 21 TO 36

The multilayer interconnection structures and semiconductor devices of Examples 21 to 36 were manufactured in a manner similar to that described in Example 5 except that reduction treatment similar to that of Example 2 was employed for the reduction of the via and copper interconnection (reduction source: ethyl acetate).

The substrate temperatures and treatment times adopted for the reduction treatments of Examples 21 to 36 are shown in Table 2.

<Evaluation of the Multilayer Interconnection Structure and Semiconductor Device>

In this way, one million semiconductor devices with vias that connect interconnections were manufactured, and the yield of the vias was determined to be 95%. In addition, resistance per one via was measured, and the ratio between this resistance value and a theoretical resistance value calculated from contact area was determined. As shown in Table 2, the via resistance ratio is in a range of 1.0 to 1.2 in all cases, leading to the conclusion that reduction treatment was fully conducted.

EXAMPLES 37 TO 52

The multilayer interconnection structures and semiconductor devices of Examples 37 to 52 were manufactured in a manner similar to that described in Example 5 except that reduction treatment similar to that of Example 3 was employed for the reduction of the via and copper interconnection (reduction source: methyl proprionate).

The substrate temperatures and treatment times adopted for the reduction treatments of Examples 37 to 52 are shown in Table 3.

<Evaluation of the Multilayer Interconnection Structure and Semiconductor Device>

In this way, one million semiconductor devices with vias that connect interconnections were manufactured, and the yield of the vias was determined to be 95%. In addition, resistance per one via was measured, and the ratio between this resistance value and a theoretical resistance value calculated from contact area was determined. As shown in Table 3, the via resistance ratio was in a range of 1.0 to 1.2 in all cases, leading to the conclusion that reduction treatment was fully conducted.

COMPARATIVE EXAMPLES 7 TO 22

The multilayer interconnection structures and semiconductor devices of Comparative Examples 7 to 22 were manufactured in a manner similar to that described in Example 4 except that reduction treatment similar to that of Comparative Example 2 (hydrogen annealing) was employed for the reduction of the via and copper interconnection The substrate temperatures and treatment times adopted for the reduction treatments of Comparative Examples 7 to 22 are shown in Table 4.

<Evaluation of the Multilayer Interconnection Structure and Semiconductor Device>

In this way, one million semiconductor devices with vias that connect interconnections were manufactured, and the yield of the vias was determined to be 58%. In addition, resistance per one via was measured, and the ratio between this resistance value and a theoretical resistance value calculated from the contact area was determined. As shown in Table 4, the via resistance value is in a range of 1.1 to 1.8 in all cases, leading to the conclusion that reduction treatment was not fully conducted.

TABLE 1

|        | Substrate Temperature (° C.) | Treatment Time (second) | Via resistance ratio (found value/theoretical value) |
|--------|------------------------------|-------------------------|------------------------------------------------------|
| Ex. 5  | 175                          | 60                      | 1.2                                                  |
| Ex. 6  | 175                          | 120                     | 1.2                                                  |
| Ex. 7  | 175                          | 180                     | 1.1                                                  |
| Ex. 8  | 175                          | 600                     | 1.1                                                  |
| Ex. 9  | 200                          | 60                      | 1.1                                                  |
| Ex. 10 | 200                          | 120                     | 1.1                                                  |
| Ex. 11 | 200                          | 180                     | 1.1                                                  |
| Ex. 12 | 200                          | 600                     | 1.0                                                  |
| Ex. 13 | 300                          | 60                      | 1.1                                                  |
| Ex. 14 | 300                          | 120                     | 1.1                                                  |
| Ex. 15 | 300                          | 180                     | 1.0                                                  |
| Ex. 16 | 300                          | 600                     | 1.1                                                  |
| Ex. 17 | 325                          | 60                      | 1.0                                                  |
| Ex. 18 | 325                          | 120                     | 1.1                                                  |
| Ex. 19 | 325                          | 180                     | 1.0                                                  |
| Ex. 20 | 325                          | 600                     | 1.0                                                  |

TABLE 2

|        | Substrate Temperature (° C.) | Treatment Time (second) | Via resistance ratio (found value/theoretical value) |
|--------|------------------------------|-------------------------|------------------------------------------------------|
| Ex. 21 | 175                          | 60                      | 1.1                                                  |
| Ex. 22 | 175                          | 120                     | 1.2                                                  |
| Ex. 23 | 175                          | 180                     | 1.1                                                  |
| Ex. 24 | 175                          | 600                     | 1.1                                                  |
| Ex. 25 | 200                          | 60                      | 1.2                                                  |
| Ex. 26 | 200                          | 120                     | 1.1                                                  |
| Ex. 27 | 200                          | 180                     | 1.1                                                  |
| Ex. 28 | 200                          | 600                     | 1.0                                                  |
| Ex. 29 | 300                          | 60                      | 1.1                                                  |
| Ex. 30 | 300                          | 120                     | 1.1                                                  |
| Ex. 31 | 300                          | 180                     | 1.1                                                  |
| Ex. 32 | 300                          | 600                     | 1.1                                                  |
| Ex. 33 | 325                          | 60                      | 1.1                                                  |
| Ex. 34 | 325                          | 120                     | 1.1                                                  |
| Ex. 35 | 325                          | 180                     | 1.0                                                  |
| Ex. 36 | 325                          | 600                     | 1.0                                                  |

TABLE 3

| | Substrate Temperature (° C.) | Treatment Time (second) | Via resistance ratio (found value/theoretical value) |
|---|---|---|---|
| Ex. 37 | 175 | 60 | 1.1 |
| Ex. 38 | 175 | 120 | 1.2 |
| Ex. 39 | 175 | 180 | 1.2 |
| Ex. 40 | 175 | 600 | 1.1 |
| Ex. 41 | 200 | 60 | 1.2 |
| Ex. 42 | 200 | 120 | 1.2 |
| Ex. 43 | 200 | 180 | 1.1 |
| Ex. 44 | 200 | 600 | 1.1 |
| Ex. 45 | 300 | 60 | 1.1 |
| Ex. 46 | 300 | 120 | 1.2 |
| Ex. 47 | 300 | 180 | 1.0 |
| Ex. 48 | 300 | 600 | 1.1 |
| Ex. 49 | 325 | 60 | 1.1 |
| Ex. 50 | 325 | 120 | 1.1 |
| Ex. 51 | 325 | 180 | 1.1 |
| Ex. 52 | 325 | 600 | 1.0 |

TABLE 4

| | Substrate Temperatures (° C.) | Treatment Time (second) | Via resistance ratio (found value/theoretical value) |
|---|---|---|---|
| Compara. Ex. 7 | 175 | 60 | 1.8 |
| Compara. Ex. 8 | 175 | 120 | 1.7 |
| Compara. Ex. 9 | 175 | 180 | 1.8 |
| Compara. Ex. 10 | 175 | 600 | 1.8 |
| Compara. Ex. 11 | 200 | 60 | 1.8 |
| Compara. Ex. 12 | 200 | 120 | 1.8 |
| Compara. Ex. 13 | 200 | 180 | 1.7 |
| Compara. Ex. 14 | 200 | 600 | 1.7 |
| Compara. Ex. 15 | 300 | 60 | 1.8 |
| Compara. Ex. 16 | 300 | 120 | 1.6 |
| Compara. Ex. 17 | 300 | 180 | 1.6 |
| Compara. Ex. 18 | 300 | 600 | 1.4 |
| Compara. Ex. 19 | 325 | 60 | 1.5 |
| Compara. Ex. 20 | 325 | 120 | 1.3 |
| Compara. Ex. 21 | 325 | 180 | 1.3 |
| Compara. Ex. 22 | 325 | 600 | 1.1 |

From the results shown in Tables, it was found that the metal reduction method of the present invention is capable of fully reducing copper oxide that inhibits signal propagation, as well as of increasing respond speed in the multilayer interconnection structure and semiconductor device of the present invention.

According to the present invention, it is possible to solve the foregoing conventional problems and to provide a reliable, efficient method for reducing oxidized metal; a multilayer interconnection structure with reduced interconnection resistance where parasitic capacities between interconnections can be reduced with the method, and an efficient method for manufacturing the same; and a high-speed, highly-reliable semiconductor device having the multilayer interconnection structure, and an efficient method for manufacturing the same.

The metal reduction method of the present invention can realize low-cost, efficient and reliable reduction of oxidized metal, and can be suitably used for dry cleaning of metals and the like using organic acids. In particular, the metal reduction method of the present invention can be used to manufacture the multilayer interconnection structure and semiconductor device of the present invention.

The method of the present invention for manufacturing a multilayer interconnection structure can be suitably used to manufacture the multilayer interconnection structure of the present invention.

The multilayer interconnection structure of the present invention can reduce parasitic capacities between interconnections to lower interconnection resistance, and can increase signal propagation speed. Thus, it is particularly suitable for semiconductor integrated circuits and the like that require higher response speed.

The method of the present invention for manufacturing a semiconductor device can be suitably used to manufacture various semiconductor devices including flash memories, DRAMs, FRAMs and MOS transistors, particularly the semiconductor device of the present invention.

The semiconductor device of the present invention realizes low parasitic capacities between interconnections and low interconnection resistance, and is thus of high-speed and high-reliability.

What is claimed is:

1. A method for reducing a metal, comprising:
hydrolyzing a vapor containing at least a carboxylic acid ester by a water vapor to thereby reduce an oxidized metal,
wherein the ratio of flow rates between the vapor containing at least a carboxylic acid ester and the water vapor is 1:0.2 to 1:2.

2. The method for reducing a metal according to claim 1, wherein the carboxylic acid ester is a compound expressed by one of the following general formulae (1) and (2):
$HCOOR_1$ General Formula (1)
$C_nH_mCOOR_2$ General Formula (2)
where $R_1$ and $R_2$ each represents a hydrocarbon of 1 to 3 carbon atoms, n represents an integer of 1 to 3, and m represents an integer of 3 to 7.

3. The method for reducing a metal according to claim 1, wherein the method is conducted under heating conditions.

4. The method for reducing a metal according to claim 3, wherein the heating temperature is 50° C. to 400° C.

5. The method for reducing a metal according to claim 1, wherein the method is conducted under vacuum.

6. The method for reducing a metal according to claim 5, wherein the vacuum pressure is 50 Pa to 500 Pa.

7. The method for reducing a metal according to claim 1, wherein the hydrolysis temperature is 50° C. to 200° C.

8. The method for reducing a metal according to claim 1, wherein the treatment time is 5 seconds to 600 seconds.

9. The method for reducing a metal according to claim 1, wherein the vapor containing at least a carboxylic acid ester further comprises at least one of methyl alcohol, ethyl alcohol, propyl alcohol, isopropyl alcohol, acetone, tetrahydrofuran, and acetonitrile.

10. The method for reducing a metal according to claim 1, wherein the method is conducted in a chamber.

11. The method for reducing a metal according to claim 10, wherein the vapor containing at least a carboxylic acid ester and the water vapor are previously mixed together for hydrolysis before introduction into the chamber.

12. The method for reducing a metal according to claim 10, wherein the vapor containing at least a carboxylic acid ester and the water vapor are individually introduced into the chamber for hydrolysis.

13. A method for manufacturing a multilayer interconnection structure, comprising:
forming a film on a work surface;
forming an interconnection; and
subjecting the surface of the interconnection formed on the work surface to reduction treatment using a method for reducing a metal, wherein the method for reducing a metal comprises:
hydrolyzing a vapor containing at least a carboxylic acid ester by a water vapor to thereby reduce an oxidized metal, and
wherein the multilayer interconnection structure comprises the film and the interconnection, and
wherein the ratio of flow rates between the vapor containing at least a carboxylic acid ester and the water vapor is 1:0.2 to 1:2.

14. A method for manufacturing a semiconductor device, comprising:
forming a resin film on a work surface;
patterning the work surface by an etching process using the resin film as a mask;
forming an interconnection on the work surface which has been patterned; and
subjecting the surface of the interconnection formed on the work surface to reduction treatment using a method for reducing a metal,
wherein the method for reducing a metal comprises:
hydrolyzing a vapor containing at least a carboxylic acid ester by a water vapor to thereby reduce an oxidized metal
wherein the ratio of flow rates between the vapor containing at least a carboxylic acid ester and the water vapor is 1:0.2 to 1:2.

15. The method for manufacturing a semiconductor device according to claim 14, wherein the etching process is any one of a dry etching process and a wet etching process.

* * * * *